United States Patent [19]

Whittaker et al.

[11] Patent Number: 5,706,424
[45] Date of Patent: Jan. 6, 1998

[54] SYSTEM FOR FAST READ AND VERIFICATION OF MICROCODE RAM

[75] Inventors: Bruce Ernest Whittaker, Mission Viejo; James Henry Jeppesen, III, Lake Forest, both of Calif.

[73] Assignee: Unisys Corporation, Blue Bell, Pa.

[21] Appl. No.: 546,651

[22] Filed: Oct. 23, 1995

[51] Int. Cl.[6] .................................................. G06F 11/34
[52] U.S. Cl. ...................... 395/185.07; 395/185.01; 371/21.1; 371/67.1
[58] Field of Search .................. 395/185.07, 185.01; 371/67.1, 71, 20.2, 21.1, 21.2, 25.1; 365/201

[56] References Cited

U.S. PATENT DOCUMENTS

| | | | |
|---|---|---|---|
| 4,491,907 | 1/1985 | Koeppen et al. | 364/800 |
| 5,474,857 | 12/1995 | Ramaknishnan et al. | 395/185.07 |
| 5,553,249 | 9/1996 | Datwyler et al. | 395/308 |

*Primary Examiner*—Phung Chung
*Attorney, Agent, or Firm*—Alfred W. Kozak; Mark T. Starr; Steven R. Petersen

[57] ABSTRACT

A system whereby a microcode RAM in a central processing module can have each microcode word rapidly accessed and transferred to a maintenance controller to compare each accessed microcode word with a corresponding microcode word in a set of microcode words which were pre-loaded in a flash memory.

6 Claims, 6 Drawing Sheets ical delay, even as long as several minutes, each time the system was initialized. Thus, without the system and method provided by this described system network, it will be seen that there were two levels of inefficiency which would occur in the reading out and verification of the microcode RAM 18 of FIG. 2.

SITUATION I: (FIG. 2): WHEN SOURCE OF MICROCODE WAS FROM DISK (OR TAPE) AND PROVIDED TO MAINTENANCE CONTROLLER 12

SYSTEM FOR FAST READ AND VERIFICATION OF MICROCODE RAM

REFERENCES TO RELATED APPLICATIONS

This application is related to a co-pending application, U.S. Ser. No. 08/546,650 filed Oct. 23, 1995 and entitled "Processor Path Emulation System Providing Fast Write Initialization for Microcode RAM."

FIELD OF THE INVENTION

This disclosure relates to systems and methods for the rapid read back and validity verification of microcode in RAM memory of a computer system.

BACKGROUND OF THE INVENTION

FIG. 3A is a diagram illustrating a computing system having the basic elements of a central processing module 10, a main system memory module 40 and one or more input/output modules 50. These modules operate by interconnecting via a dual system bus structure such as system bus A, $22_a$ and system bus B, $22_b$. These involve two identical and interchangeable system busses providing a dual system bus structure.

FIG. 3B indicates an enhancement to the system of FIG. 3A by adding the maintenance subsystem module 60. The maintenance subsystem module provides both diagnostic functions to all system modules and is also required to initialize all system modules and to "start-up" the system for subsequent operation. The maintenance subsystem module 60 is seen connecting to all of the system modules via the dashed line connections, 64a, 64b and 64c. These lines are seen connected to the central processor module 10, the input/output modules 50, and therein system memory module 40. These dashed line connections represent the standard maintenance connections of a system designated as the JTAG system which is specified in IEEE 1149.1, and used for diagnostic and maintenance purposes.

The IEEE 1149.1 Standard represents an industry standardized interface which provides a bit serial data transfer between the various target modules and the maintenance subsystem 60. Through this bit serial interface, all the system modules are set-up (initialized) for system operation. This interface is a system compromise between cost and performance. It is inexpensive in cost since it is standard and only a few wires are required since it is a bit serial data transfer. However, the bit serial aspect always makes the operations very slow if massive amounts of information must be transferred. Normally, system initialization does not require an overburdened amount of data transfer to most modules. However, the situation often presented in this environment, is one where significant time is lost if only the standard JTAG interface system is used for initialization of the central processing module 10 (CPM). Thus, it is a desirable condition and, as provided for in the present disclosure, for establishing a situation which calls for, not only the use of the JTAG connections, but an efficient way by which the maintenance subsystem 60 can utilize the high speed and wide normal bus structures of system busses 22a and 22b.

In earlier designs, there was considerable inefficiency in reading out the microcode RAM memory of a computer system. If the logic were implemented only as depicted in FIG. 2, the necessary reading-out and the then the verification of the microcode routines would eventually but be accomplished relatively slow. However, there would be a significant delay, even as long as several minutes, each time the system was initialized. Thus, without the system and method provided by this described system network, it will be seen that there were two levels of inefficiency which would occur in the reading out and verification of the microcode RAM 18 of FIG. 2.

SITUATION I: (FIG. 2): WHEN SOURCE OF MICROCODE WAS FROM DISK (OR TAPE) AND PROVIDED TO MAINTENANCE CONTROLLER 12

The first inefficiency in the reading out and verification of microcode words in the microcode RAM 18, would be the source of, for example, the 384K bytes of microcode data against which the values which were read out from the microcode RAM 18 would be compared. The source can be seen from FIG. 2 as having to be the cartridge tape 61, or one of the disks 62 and 63, which connect directly to the maintenance processor 6. Normally, the source would logically be the hard disk peripheral 62. However, every byte of the microcode data would have to be transferred over the serial interface $60_{si}$ between the Central Processing Module (CPM 10) and the Maintenance Subsystem 60.

The protocol on the serial interface $60_{si}$ is not such to allow "bursts" of data, but rather requires several actions of operating protocol for each byte of data transferred. For off-line diagnostic operations, this seeming inefficient serial method is sometimes sufficient. However, since the microcode bytes being issued must be done every single time the system is initialized, the overhead of the serial interface $60_{si}$ and the slowness of reading the disk is a very significant factor in the inefficiency of operation.

SITUATION II: (FIG. 2): USAGE MADE OF THE JTAG SERIAL PATHS WITHIN THE CPM 10

The second type of inefficiency characteristic of earlier art, is the standard JTAG interface used on the CPM module 10 to connect all the on-card components of the maintenance controller 12, FIG. 2. Again, for standard diagnostics of the CPM, this JTAG interface is often sufficient and cost effective, however, for the operation of reading out and verifying the large microcode data base contained in the microcode RAM 18, it becomes immediately apparent how inefficient and undesirable this operational type of system functions.

Using only the JTAG serial connections shown in the dotted lines of FIG. 2, it is quite possible to read and verify the instruction code words in the microcode RAM 18. Using this procedure would require a number of separate items to be shifted by the maintenance subsystem 60. It should be indicated that the RAM devices such as the microcode RAM 18 are not JTAG devices and therefore there is no direct JTAG path into them which exists. Thus, the functional steps that were earlier necessary, were as follows:

(i) The maintenance sub-system 60 shifts the RAM address values to the maintenance controller 12 and thence into the Data Path Array 20 via the bus $12_d$. This can then be a source of addresses for the microcode RAMs 18.

(ii) The maintenance controller 12 then shifts the appropriate control states into the Control PAL 16 to cause the RAM Read operation to occur and for data readout the RAM 18 to be strobed into a read register $20r$ in the Data Path Array 20. Thus, FIG. 2 shows the Read register $20_r$ in the Data Path Array 20.

(iii) The maintenance controller 12 shifts the first half of the 90-bit microcode word (45 bits) from the Data Path Array 20 into the maintenance controller 12 and thence over the serial interface $60_{si}$ to the maintenance subsystem 60.

(iv) There is a repetition of steps (ii) and (iii) for the second half of the 90-bit microcode word (45 bits).

(v) Maintenance software in the maintenance sub-system 60 will verify each microcode word read (from the microcode RAM 18) against the data base held in the console hard disk 62.

(vi) There is a repetition of steps (i) through (v) for each one of the 32K microcode words.

The above series of steps will entail many bit serial shifts of some very long shift chains (possibly 2,000 flip-flops). The above procedure which is controlled by the maintenance software running in the maintenance processor 64 will indeed then read and verify each word of the microcode RAM 18, but it will take a very long time, possibly several minutes.

The system and method presently disclosed herein will be seen to greatly improve the operation of reading and verifying the microcode in a much shorter period of time at virtually no additional hardware cost. Thus, the present disclosure functions to overcome the types of efficiencies discussed above and operates to provide a faster method for sourcing the large microcode database for comparison purposes and secondly for enhancing the actual microcode RAM read loop.

With reference to FIG. 2, there is seen the earlier architecture for the central processing module 10 interconnected with the maintenance subsystem 60 via a serial interface bus $60_{si}$. The maintenance subsystem 60 may have a tape unit 61 for holding data, a hard disk 62 for holding data and a floppy disk 63 also holding data wherein each of these data reservoirs are fed to the maintenance processor 64 for conveyance on the serial interface $60_{si}$ thence over to the maintenance controller 12 of the central processing module 10. The dotted lines in FIG. 2 show the serial JTAG connections used for maintenance and diagnostics of the processor 14, PAL Controller 16 and Data Path Gate Array 20 which have boundary scan circuits for JTAG operations.

In the central processing module 10, the maintenance controller 12 is seen to have serial JTAG connections 12p to the processor 14; to the programmable array logic PAL Controller 16 via line 12c and to the Data Path Gate Array 20 via line 12d.

Thus, FIG. 2 indicates some of the internal circuitry units of the central processing module 10 and also some of the peripheral mechanisms of the maintenance subsystem 60.

Within the maintenance subsystem 60, the cartridge tape 61, the hard disk 62 and the floppy disk 63 are peripheral units which are controlled by the maintenance processor 64. These devices in the maintenance subsystem can provide a large data base of information that may be necessary to initialize and set up the processing system network for operation.

Also seen in FIG. 2 are several major circuitry blocks of the processor logic in the central processing module 10. These include the processor 14, also called a "processing element" (PE), the Data Path Array 20, the programmable array logic (PAL) controller 16 called the "PAL Controller 16" and the microcode RAM internal memory 18.

In this architecture, the processor 14 can access the major system modules 40, 50 shown in FIG. 2 via the dual system busses 22a and 22b by means of the on-card Data Path Array 20. The Data Path Array 20 converts timing rates from the on-card high speed processor bus 14b to the slower intermodule system busses 22a and 22b.

Software controls and flexible programmable array logic for the PAL controller 16 is used to provide control of the processor bus 14b and the system busses 22a and 22b and also the Data Path Array 20 functions. The on-card versions of the serial JTAG connections are shown as the dashed lines indicated in FIG. 2 as 12p, 12c, and 12d.

SUMMARY OF THE INVENTION

A system for fast Read of microcode RAM and verification is described in a network involving a Central Processing Module connected to a maintenance sub-system. A maintenance processor communicates on a serial interface to a maintenance controller in order to initiate a read-out of a microcode RAM in the Central Processing Module 10. The maintenance controller is supported by a Flash Memory RAM which holds all of the presently used microcode words which were downloaded from the maintenance subsystem during initialization routines. The maintenance controller 12 operates through a transfer bus $12_b$ to a Data Path Array 20 which communicates with the microcode RAM 18 via a processor internal bus $14_b$. The maintenance controller 12 also initiates control signals to a Control PAL 16 for enabling the reading out of microcode words in the microcode RAM 18 for transfer to a Read register in the Data Path Array. Each word in the Read register is then moved over the transfer bus to the maintenance controller for subsequent return to the maintenance controller which can then compare each word (derived from the microcode RAM) with the microcode words on the Flash Memory RAM.

By enhancing the read-out loop with the processor internal bus and the transfer bus directed by the Control PAL, the maintenance controller can provide a fast read-out and exit of microcode words from the microcode RAM 18 for a verification and check-out against the pre-loaded microcode in the Flash Memory RAM.

DESCRIPTION OF PREFERRED EMBODIMENT

Figure 1:
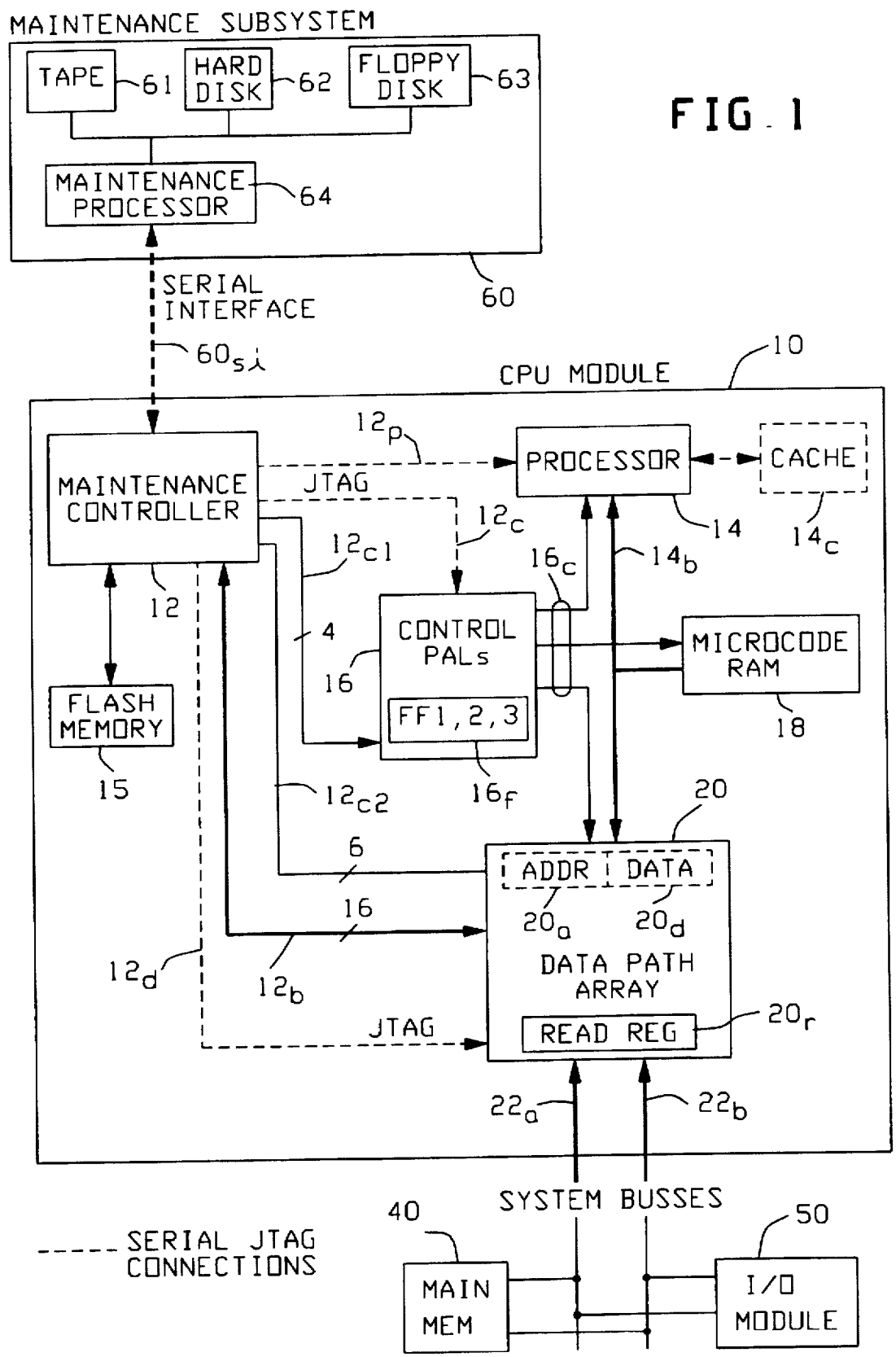
FIG. 1 is a network diagram of the present system for fast Read and verification of a processor's microcode RAM.
Figure 2:
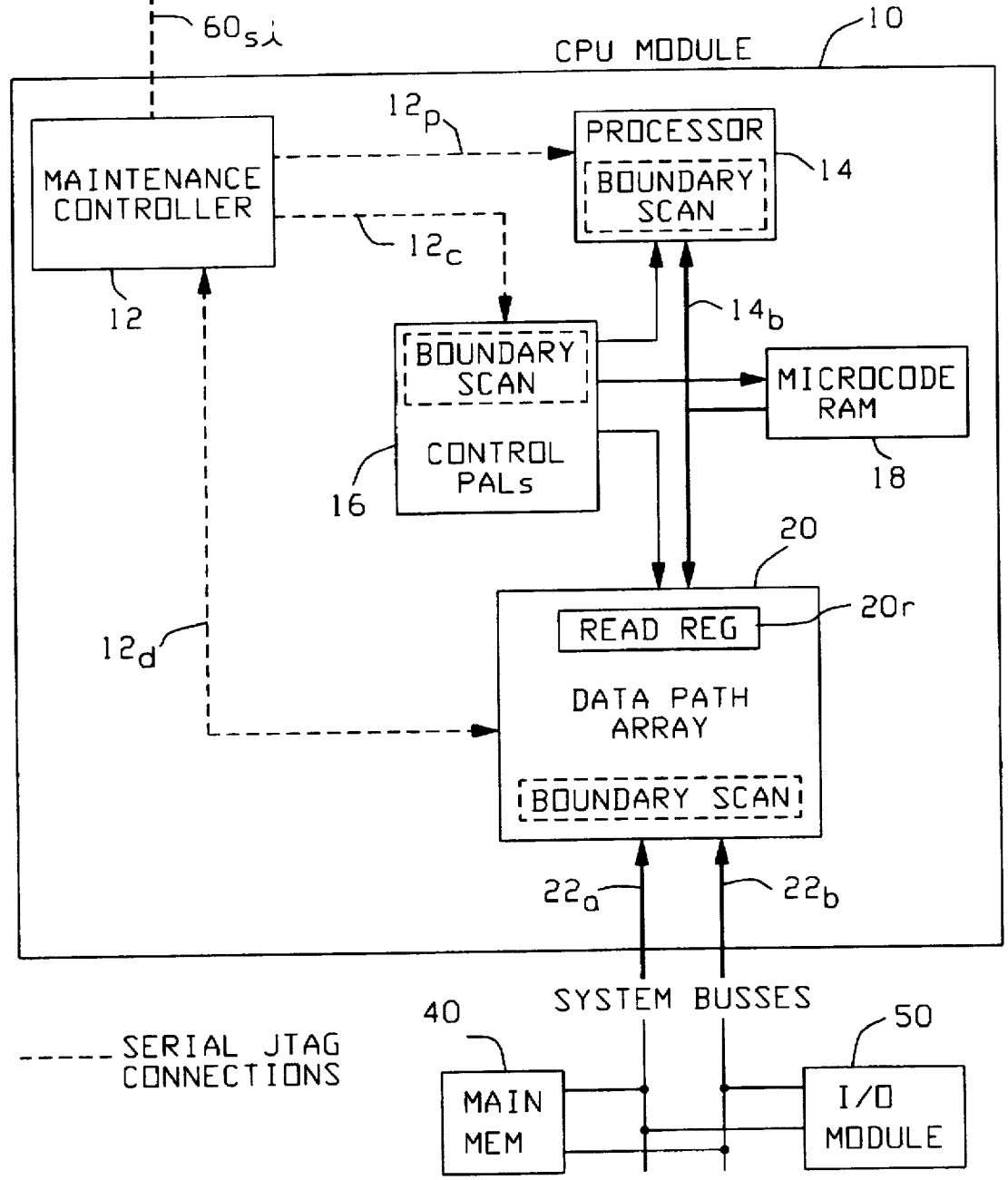
FIG. 2 is block diagram of earlier art which involved the processor's continuous usage for controlling the read-out of data words in the microcode RAM.
Figure 3A:
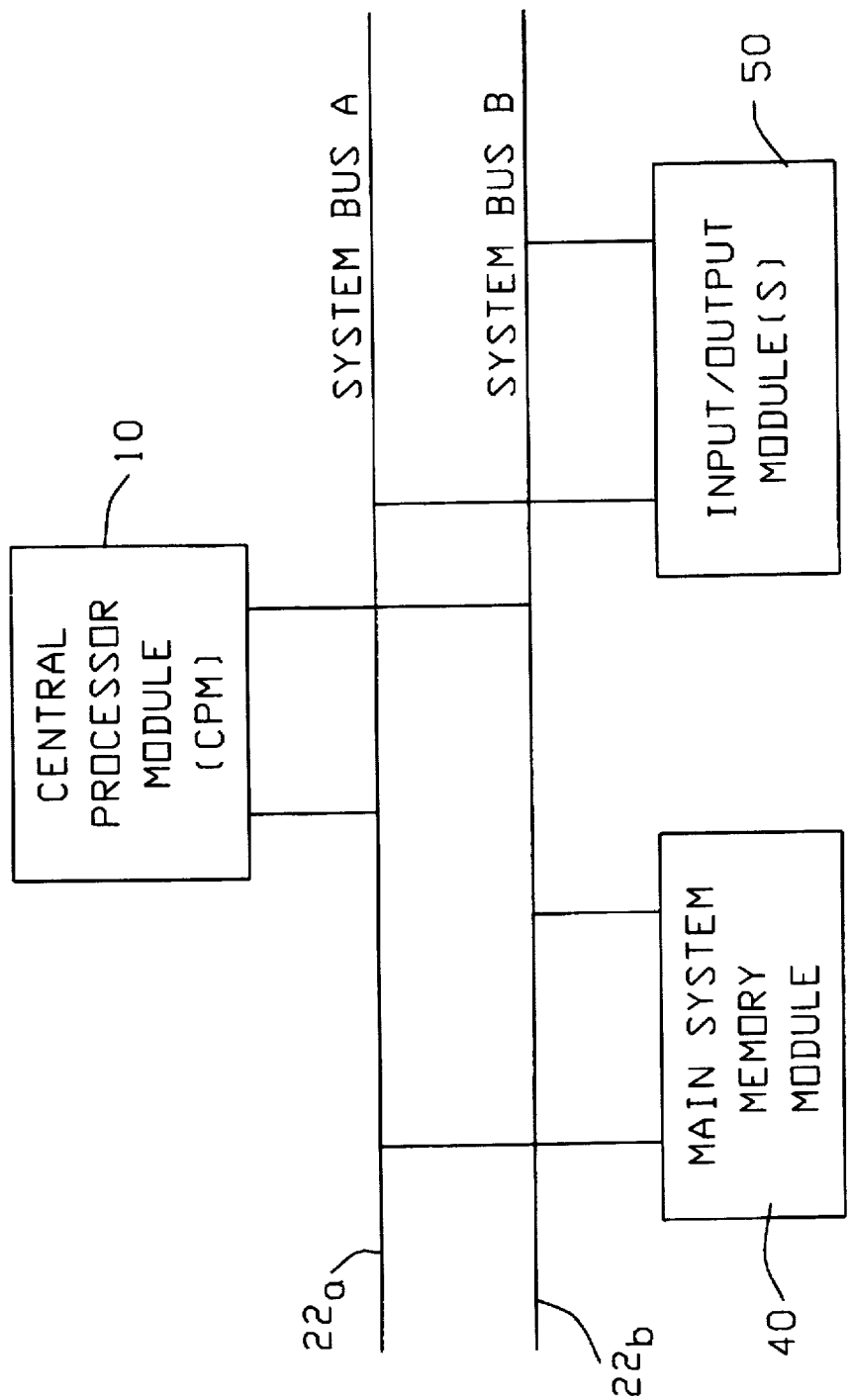
FIG. 3A is a generalized block diagram of a computer system using dual busses for connection to a network of digital modules.
Figure 3B:
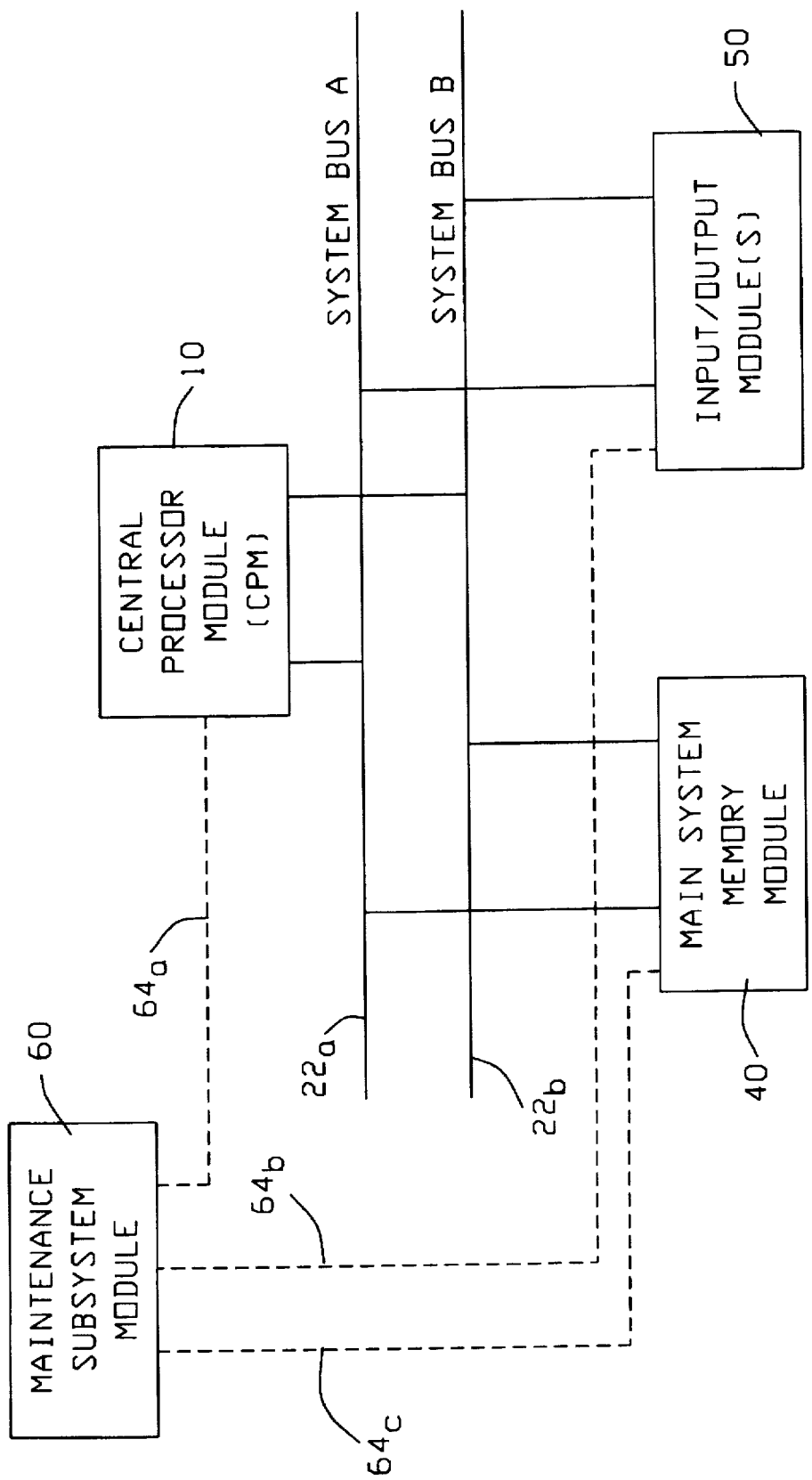
FIG. 3B is a block diagram of a computer system being enhanced with a maintenance sub-system module.

Referring to FIG. 1, there is seen the fast Write and verification system which is enhanced over the earlier system shown in FIG. 2. The maintenance subsystem 60 connects via serial interface $60_{si}$ to the maintenance controller 12 in the Central Processing Module (CPM) 10. The maintenance controller 12 has a Flash Memory 15 which is a Ram storage unit within the Central Processing Module. This flash memory storage is non-volatile but can be modified by the maintenance sub-system 60. The flash memory 15 can provide a large on-card data storage facility for the maintenance controller 12. Under normal operating cases, especially on system initialization, the microcode RAM 18 will be loaded from the data base stored within the Flash RAM 15 without any need to access data from the maintenance sub-system 60, since the Flash Memory 15 has been pre-loaded for this purpose.

The Data Path Array 20 has an address register $20_a$ for holding address data relating to the Microcode RAM 18, plus a data register $20_d$ for holding data to be loaded into RAM 18 during initialization.

For the reading and verification of the microcode RAM 18 of FIG. 1, the database held in the Flash Memory RAM 15 will serve as the source for comparison. This path is very fast, especially when contrasted to the serial path of $60_{si}$ from the maintenance processor 64. It is only when new microcode is added to the system, that it is necessary for the database to be transferred across the serial interface $60_{si}$ from the tape cartridge 61 or hard disk 62. When this occurs, then the Flash Memory RAM 50 will be written with a new database.

ENHANCED MICROCODE RAMREAD LOOP

FIG. 1 will indicate two new direct controls on bus $12_{c1}$ (4 bits) and $12_{c2}$ (6 bits) and a new direct bus $12_b$ (16 bits) from the maintenance controller 12, in order to provide for a much improved microcode RAM Read loop. This enhanced loop allows the maintenance controller 12 to utilize the normal fast, wide paths 12b and 14b to and from the microcode RAM 18, rather than using the slow serial JTAG paths $12_p$, $12_c$ and $12_r$. The new direct connections allow the maintenance controller 12 to emulate the actions which the normal processor logic 14 would take with regard to the microcode RAM 18, thus relieving the cyclic load on processor 14. Thus, the programmable aspects of the maintenance controller 12 provide a special flexibility in its emulation function.

DATA PATH ARRAY (NEW MODE)

The Data Path Array 20 of FIG. 1, since it connects to the processor bus $14_b$ (having address lines and data lines) on which the microcode RAM 18 resides, has a path to the address and data connections of the microcode RAM 18. In operations under the earlier art, for each word written into the microcode RAM 18, the values for the address and data had to be shifted serially via the JTAG path into and out of the boundary registers of the Data Path Array 20. In this way, the Data Path Array 20 could source the address value to the RAM 18 and then capture the RAM Read data.

In the enhanced system shown in FIG. 1, there is provided an additional parallel path into the Data Path Array 20 from the maintenance controller 12. This path is shown by the bus $12_b$. Further, the new direct connections provided include five control signals and the 16-bit bus $12_b$. Thus, the maintenance controller 12 has a control line $12_{c1}$ to the Control PAL 16 and a control line $12_{c2}$ to the Data Path Array 20. The Control PAL 16 has control lines $16_c$ to the microcode RAM into the Data Path Array 20.

With the use of the 16-bit direct bus $12_b$, this allows the necessary wider fields which involve an address of 32-bits in a microcode word of 90-bits, to be much more quickly built up for the read-out of the Data Path Array 20. This faster enablement could not have been done via the earlier serial JTAG shifting method. The signals involved in the new direct interface are described herein in TABLE I.

TABLE I

CONTROL SIGNALS FROM MAINTENANCE CONTROLLER 12
(LINES 12c2 FIG. 1)

| | |
|---|---|
| MP_LADDB | Signal from the Maintenance Controller causing the current value on the MP_DATA bus to be loaded into the |

TABLE I-continued

CONTROL SIGNALS FROM MAINTENANCE CONTROLLER 12
(LINES 12c2 FIG. 1)

| | |
|---|---|
| | selected portion of the Data Path Array address register. |
| MP_STRDATLB | Signal from the Maintenance Controller causing the current value on the MP_DATA bus to be loaded into the selected lower portion of the Data Path Array data register. (Note: used for reading Microcode RAM). |
| MP_STRDATUB | Signal from the Maintenance Controller causing the current value on the MP_DATA bus to be loaded into the selected upper portion of the Data Path Array data register. (Note: used for reading Microcode RAM). |
| MP_REGSEL (1:0) | Two signals from the Maintenance Controller used to select which portion of the data register in the Data Path Array is to be loaded or read. |
| MP_ADDINCB | Signal from the Maintenance Controller causing the value in the Data Path Array address register to be incremented by one. |

Note: Signals ending in "B" are active low.

Thus, the direct interface seen in FIG. 1, while minimal as to hardware impact, is unusually significant as to enhancing the Read microcode RAM loop. The address value need only be issued once by the maintenance sub-system 60 and can thereafter be easily and quickly incremented to the next address value by the Control PAL 16. Further, the data values read from the microcode RAMs 18 can be easily steered to the maintenance controller 12 in a fraction of the time and effort previously required to send data via the serial interface $60_{si}$ to the maintenance processor 64. Further, the time for the maintenance software in maintenance processor 64 to calculate the new address for each word, is now saved. Once the address is in the Data Path Array 20, all that is necessary to emulate the processor paths to the microcode RAM 18 is that the necessary high-speed control signals be activated by the maintenance controller 12 as they would ordinarily be for normal processor operations. The maintenance controller 12 uses the Control PAL 16 to functionally control the read-out of the RAMs 18 without involving processor 14 in this read and verify cycle.

CONTROL PAL 16 (NEW MODE)

The Control PALs 16 provide the master logic which decodes processor commands and which controls the steering of all data into and out of the Data Path Array 20. The Control PAL(s) also provide all the control and timing required for either the Write-to or Read-from the microcode RAM 18. All bus traffic on the processor bus $14_b$ is directed by signals from the Control PALs 16. Further, the Control PALs 16 control all actions at the full clock speed of the processor 14. Thus, all the unnecessary controls are already in place to either Write data into the microcode RAM or to Read data from the microcode RAM 18. The Control PAL 16 already has signals necessary to steer the address value in the Data Path Array 20 (address register $20_a$) onto the processor bus, bus $14_b$. Also the Control PAL 16 already has signals needed to cause the Data Path Array 20 to capture data from the microcode RAM 18 in a Read register $20_r$. The control lines $16_c$ from the Control PAL 16 are used to send control signals to the microcode RAM 18 and also into the Data Path Array 20. The Control PAL 16 can operate all of its functions at full processor speed, rather than in a slow, serial type operation which would be required using the JTAG lines $12_a$, $12_p$ and $12_c$. TABLE II shown below indicates the pertinent normal control signals.

TABLE II

CONTROL SIGNALS FROM CONTROL PAL 16 (LINES 16c, FIG. 1)

| | |
|---|---|
| G_DRVADDB | Signal to Data Path Array to enable driving of address values out onto the processor address bus, 14b. |
| G_LDINB | Signal to Data Path Array to load in-bound data values from the processor data bus 14b into the input holding register $20_r$. |
| CS_ADSCB | Signal to Microcode RAM causing the current address value on the processor address bus to be strobed into the RAM, 18. |
| CS_OEB | Signal to the Microcode RAM allowing it to drive its currently addressed data value onto the processor bus, 14b |

Signals ending with "B" are active low.

Figure 4:
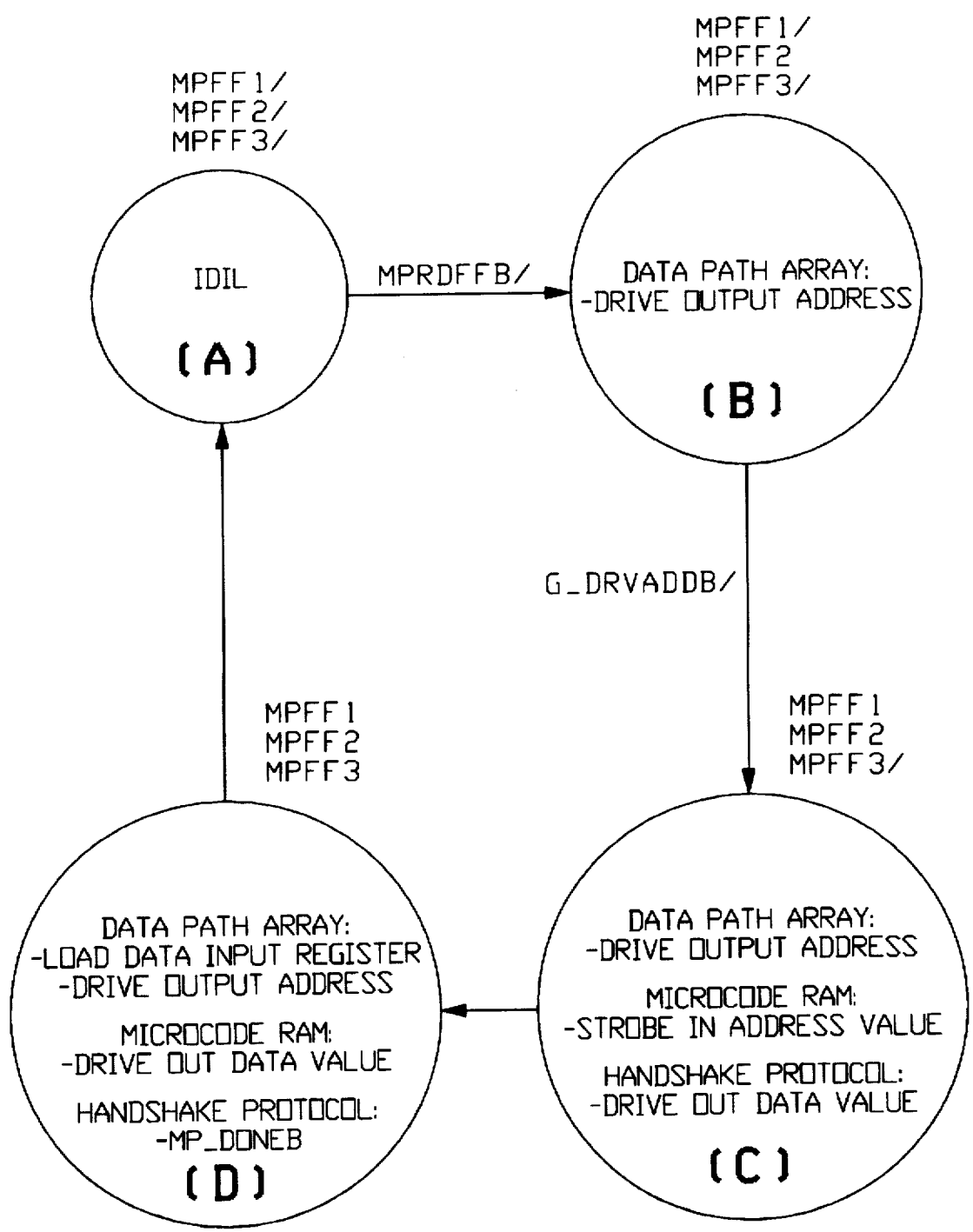
FIG. 4 is a sequence diagram showing various of the sequential steps involved in reading out microcode instruction words from the microcode RAM.

The present enhancement in FIG. 1 is arranged to add a simple direct way by which the maintenance controller 12 can cause the sequences, that normally control these signals, to be executed as seen in FIG. 4. In effect, the new direct controls from the maintenance controller 12 simply provide a "logical OR" into the existing control logic for these signals.

The TABLE III indicates the logic signals generated from the PAL controller 16 of FIG. 1.

TABLE III

LOGIC EQUATIONS FOR CONTROL SIGNALS FROM PAL CONTROLLER 16

| LOGIC EQUATION | DESCRIPTION |
|---|---|
| G_DRVADDB := | |
| RDLRU*RDMISSFF*RDCMPLT*READ4 | normal logic |
| + MPFF2 | maintenance controller term |
| G_LDINB := | normal logic |
| BIUOPFF+MEM_OP | |
| + MPFF2 * MPFF3/ | maintenance controller term |
| CS_ADSCB = | normal logic |
| MEM_OP_1 * READ2 * MEMFF1X/ | maintenance controller term |
| + MPFF1 * MPTEST0 | |
| CS_OEB := | normal logic term |
| MEM_OP_1 * READ2 * MEMFF1X/ | normal logic term |
| + MEMFF1 | maintenance controller term |
| MPFF2 *MPRDBFFB/ *G_DRVADDB/ *MPTEST0 | |

Notes:
:= means to set a D-Flip-flop
= means a gate (combinatorial) term
+ means logical-OR
* means logical-AND
/ means logical-NOT
. . . means more normal logic not shown

GLOSSARY FOR TABLE III

1. G_DRVADDB: This signal enables Data Path Array 20 to drive address data on an address bus.
RDLRU: This signal decodes the Read 4 command from the processor 14.
RDMISSFF: This signal indicates a Read-Miss is in progress and starts a system bus Read cycle.
RDCMPLT: This signal indicates that a system bus cycle is complete.
READ4: This signal decodes the 4-word Read command.
MPFF2: This signal from the 2nd flip-flop in Control PAL 16 initiates (FIG. 4) the addressing of microcode words to be Read out from RAM 18.

TABLE III-continued

| | | |
|---|---|---|
| 2. | G_LDINB: | This signal enables Data Path Array 20 to load-in data from the data bus 12b. |
| | BIUOPFF: | This signal decodes non-memory commands of the Data Path Array 20. |
| | MEM_OP: | This signal enables decoding of memory-type commands. |
| | MPFF2: | This signal when the 2nd FF is "on", initiates addresses for data to be read out of RAM 18. |
| | MPFF3/: | This is the "off" signal of the 3rd FF in Control PAL 16 and operates as shown in FIG. 4. |
| 3. | CS_ADSCB: | This signal causes the microcode RAM 18 to strobe in the address-value of each word onto the address bus on 14b. |
| | MEM_OP_1: | This is a fan-out of the MEM_OP signal. |
| | READ2: | This signal decodes the Read-2 microcode command. |
| | MEMFF1X/: | This signal enables a time extension for reading the second word of the Read-2 command. |
| | MPFF1: | This "on" signal from the 1st FF in Control 16 operates to enable the sequences in FIG. 4. |
| | MPTEST0: | This signal is from a Test Mode Switch set by the maintenance controller 12 for enabling special modes such as selecting a Read to main memory. |
| 4. | CS_OEB: | This signal causes the microcode RAM to drive out data onto the data bus section at bus 14b. |
| | MEMFF1: | This "on" signal of FF1 turns on for the first word of the Read-2 command. |
| | MPRDBFFB/: | This signal, from maintenance controller 12, is a synchronization signal from a ff for a Read count. |

In addition to the new "OR" terms seen in TABLE III, a new sequence to handle the protocol for the direct control from the maintenance controller 12 is added to the PAL Controller 16. This is indicated hereunder with the description of "Direct Protocol".

DIRECT PROTOCOL (NEW MODE)

In order to provide the ability to emulate the usage of a high-speed wide bus structure (of busses 14b and 12b) by the maintenance controller 12, there is provided a four-signal direct control interface $12_c1$ which is connected between the maintenance controller 12 and the Control PAL 16. The Control PAL 16 operates at the maximum clock rate of the processor, while the maintenance controller 12 operates at a much slower clock rate. Therefore, this new direct interface must provide for the asynchronous condition which is handled by a simple handshaking arrangement.

Of the four new signals on bus $12_c1$ in this direct interface, only two of these signals are used for reading the microcode RAM 18. TABLE IV appended below shows the signals on the bus $12_c1$.

TABLE IV

SIGNALS FOR READING MICROCODE RAM 18 (RE: 4 LINES 12c1, FIG. 1)

| | |
|---|---|
| MP_WRB | (not used here). |
| MP_DONEB | Return handshake signal from the Control PAL indicating that the current operation is now complete. |
| MP_RDB | Read control signal from the Maintenance Controller indicating that the Control PAL should execute a Microcode RAM read operation. |
| MP_MEMOP | (not used here) |

B = active low signals.

The incoming signal MP_RDB is captured (after being synchronized to the processor clock rate) in a flip-flop designated MPRDBFFB in the Control PAL 16. The flip-flop is then used in the control sequence for FIG. 4.

Figure 5:
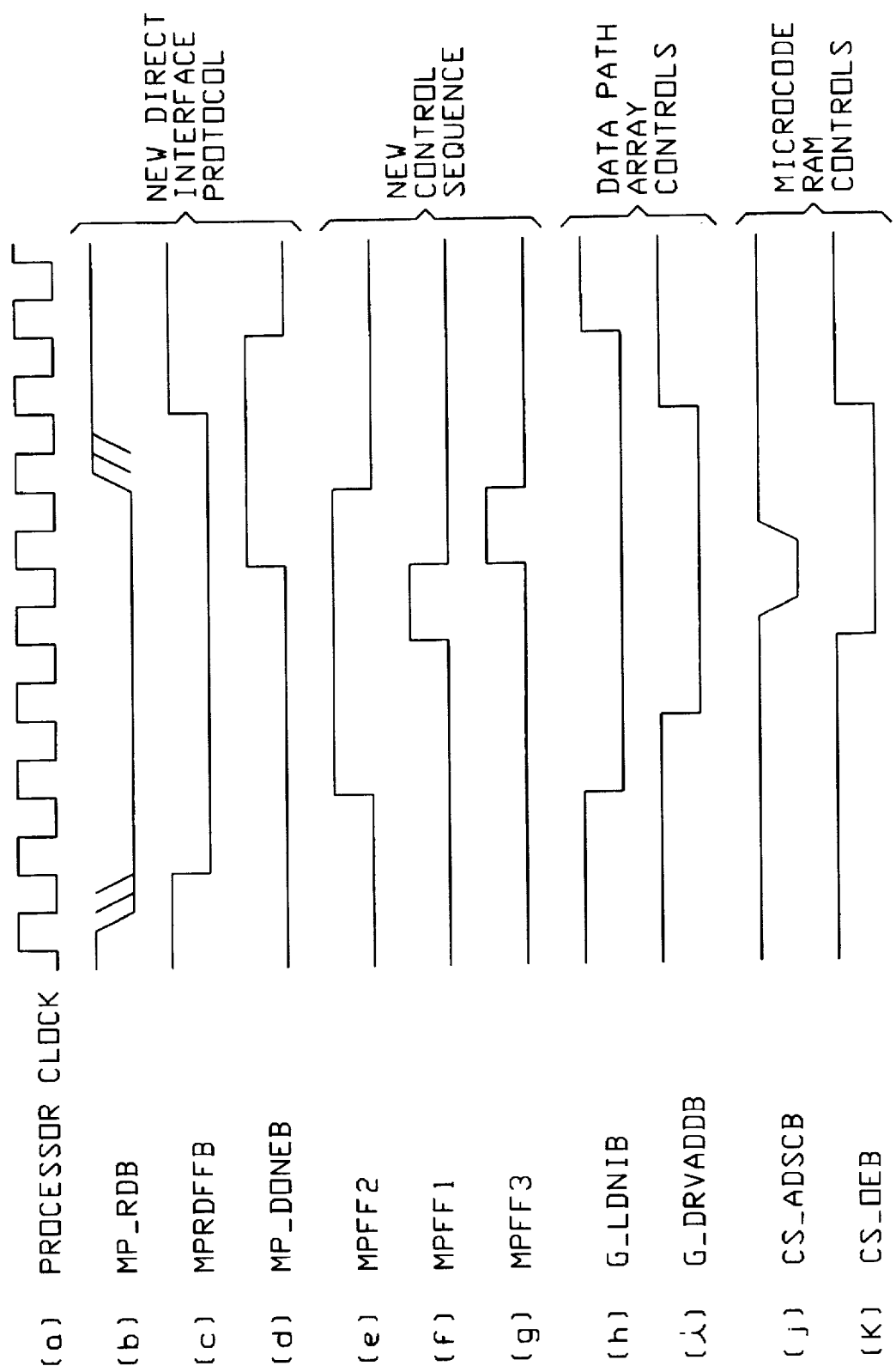
FIG. 5 is a timing diagram showing the protocol control sequences for reading out the microcode RAM.

There are three flip-flops (designated 16f in FIG. 1) which are shown also in FIG. 4 and designated MPFF1, MPFF2, MPFF3. These three flip-flops in the Control PAL 16 are used to control the sequence of the protocol and the fast bus 14b. FIG. 4 shows the sequence of control operations, while FIG. 5 shows the timing of the protocol, the sequence flip-flops, and the various normal control signals involved in reading the microcode RAM 18.

Referring to FIG. 4 there is seen a sequential diagram of operations for the read-out of the microcode RAM 18. Thus, in FIG. 4, the first condition at (A) is the idle condition where each one of the control flip-flops (MPFF1,2,3) is off. When the maintenance controller Read command is provided, the system converts to the status (B) where the Data Path Array 20 will drive the output address to the microcode RAMs 18 and wherein the second flip-flop MPFF2 is turned on.

In sequencing from the status (B) to the status (C), the Drive address command is passed on to the Data Path Array 20 to drive the output address and thence to have the microcode RAM strobe in the address value and drive out the data value. At this sequence position (C), the two flip-flops FF1 and FF2 are turned on and flip-flop FF3 is off.

Subsequently, moving from the status position (C) to the status position (D), it will be seen that each one of the three control flip-flops are now "on" whereupon the Data Path Array 20 will load its data input register and drive the output address so that the microcode RAM will drive out the data value. The maintenance controller 12 will provide a completion signal, after which the system will return to the idle status (A).

Referring to FIG. 5, the line (a) shows the processor clock timing signals and line (b), (c) and (d) show the protocol for the new direct interface signals where line (b) shows the maintenance controller Read command, line (c) shows the Read flip-flop signal while line (d) shows the completion signal.

The control sequences are shown in lines (e), (f) and (g). Here, there can be seen the control flip-flops 16, of FIG. 1 in the Control PAL 16 where, initially all the flip-flops are "off", and then on line (e) the flip-flop 2 is turned "on" and subsequently on line (f) the flip-flops 1 and 2 are "on" (as seen in FIG. 4 at status C), and then on line (g) where the third flip-flop 3 is turned "on" so that all flip-flops are "on" at the status (D) of FIG. 4.

The Data Path Array controls are shown at line (h) for loading the Data Path Array 20 with the driven address at line (i).

The microcode RAM controls are shown on line (j) and on line (k), where line ( ) CS_ADSCB is the signal causing the address on bus to be captured by Data Path 20 and line (k) CS_OEB causes the microcode RAM to drive out data words (code) onto bus 14b.

The presently described system for reading and verification of the microcode RAM of the Central Processing Module using the fast emulation path is seen to be implemented with very little additional hardware cost. The new bus 12ᵦ and the controls 12ₑ1 and 12ₑ2 into the Data Path Array 20 will take up some 22 additional array connection pins, but however, and since they are generally already available which is very often the case, then the change to the array is free. The extra silicon usage which is internal to the Data Path Array is there for the taking.

In the case of the new direct interface protocol sequence of FIG. 4 and 5, and the extra OR terms which are built into the Control PAL 16, again this is completely implemented using the spare capacity within the existing programmable array logic devices and no new hardware is added. The interconnections for the control signals and the bus transfer 12b require a few more etch connections on the printed circuit board, but the cost of these is almost negligible.

In summary, the herein described system provides the capability for a large microcode data base to be quickly read from the microcode RAMs and to be verified by a maintenance controller with Flash Memory, each time the system is initialized. By using the existing high-speed, wide bus paths and then emulating the normal controls utilized by the high speed logic, by using a maintenance controller and Control PAL, the present system allows the reading and verification of microcode to be virtually invisible to the human operator and to accomplish this in a much-reduced period of time, which in the prior art often took many minutes.

While a preferred embodiment of the above-referenced system has been described, it should be understood that the concept of the invention has been encompassed by the following claims.

We claim:

1. A system for rapid readout and verification of microcode words in a microcode RAM comprising:
   (a) means to pre-load and store microcode words into a flash memory in a central processing module having a high-speed processor bus connecting a microcode RAM, and a Data Path Array means, said microcode words being subsequently loaded into said microcode RAM;
   (b) Control PAL means to address and read out each microcode word in said microcode RAM for temporary placement in said Data Path Array means;
   (c) said Data Path Array means including:
      (c1) read out register means for temporary storage of addresses and microcode words retrieved from said microcode RAM via said high-speed processor bus;
   (d) means to transfer each said microcode word from said Data Path Array means to a programmable Maintenance controller means in said central processing module, said means to transfer including:
      (d1) data bus means for high-speed parallel transfer of said addresses and microcode words from said Data Path Array means to said programmable maintenance control means;
      (d2) control bus means, from said programmable maintenance controller means, for initiating said Control PAL means and said Data Path Array means for transfer of addresses and microcode words on said data bus means;
   (e) said maintenance controller means for receiving each read-out microcode word and including:
      (e1) comparison means for comparing each byte of said read-out microcode word to each byte of the microcode word in said flash memory having the same address, in order to verify the validity of each byte of each said read-out microcode word.

2. The system of claim I wherein said means to pre-load and store includes: (a) external maintenance subsystem means operating as a source of microcode addresses and words for loading said flash memory.

3. The system of claim 1 wherein said Control PAL means to address and read out includes:
   (a) programmable array logic means for strobing addresses to said microcode RAM to read out microcode words for placement in said Data Path Array means, said programmable array logic means including:
      (a1) means to sequence a series of addresses to said microcode RAM for sequentially reading out each of said microcode words; and (a2) means to transfer each read-out microcode word to said programmable maintenance controller means via said high-speed parallel data bus means.

4. The system of claim 3 wherein said maintenance controller means includes:

(a) means to initiate and control said programmable array logic means and said Data Path Array means for readout and transfer of microcode words for return to said comparison means.

5. A system for rapid readout of and validity verification of microcode words in a microcode RAM of a central processing module, said system comprising:

(a) flash memory means pre-loaded with a set of "W" microcode words and associated addresses from an external maintenance subsystem;

(b) maintenance controller means for receiving said microcode words and associated addresses from said maintenance subsystem for loading into said flash memory means and including:

(b1) means to receive each microcode word readout from said microcode RAM for comparison with its associated microcode word in said flash memory means;

(c) means for addressing said microcode RAM and reading out each address and microcode word into a Data Path Array for transfer to said maintenance controller means for verification of the validity of each said microcode word by comparison with its associated word in said flash memory means;

(d) means to transfer each address and microcode word in said Data Path Array to said maintenance controller means via a high speed parallel data bus means, said means including:

(d1) Control PAL means for initiating transfer of addresses and microcode words on said high speed parallel data bus means;

(d2) said data bus means providing high-speed data transfer of said addresses and microcode words, to said maintenance controller means.

6. A system for reading out instruction words in a microcode RAM and transferring them to a maintenance controller for verification, comprising:

(a) maintenance controller means for initiating a programmable array logic controller to address and read out each microcode word in a microcode RAM, including:

(a1) means to verify each of said words read out from said microcode RAM by comparison with preloaded microcode words stored in a flash memory;

(b) said microcode RAM connected to a central processor and to a data path array via an internal high speed processor bus;

(c) a high-speed parallel transfer bus connecting said maintenance controller to said data path array for transferring microcode words received, via said internal high-speed processor bus, from said microcode RAM over to said maintenance controller;

(d) a programmable array logic controller, initiated by said maintenance controller, for addressing each word in said microcode RAM and transferring it to said data path array;

(e) said data path array for receiving each address and microcode word from said microcode RAM and transferring said address and microcode word to said maintenance controller under control of said programmable array logic controller;

(f) said maintenance controller means including means to compare each one of said instruction code words from said microcode RAM with microcode instruction words residing in said flash memory in order to verify the validity of each word.

* * * * *